(12) United States Patent
Teo et al.

(10) Patent No.: US 9,583,607 B2
(45) Date of Patent: Feb. 28, 2017

(54) SEMICONDUCTOR DEVICE WITH MULTIPLE-FUNCTIONAL BARRIER LAYER

(71) Applicant: Mitsubishi Electric Research Laboratories, Inc., Cambridge, MA (US)

(72) Inventors: Koon Hoo Teo, Lexington, MA (US); Yuhao Zhang, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/841,967

(22) Filed: Sep. 1, 2015

(65) Prior Publication Data

US 2017/0018638 A1    Jan. 19, 2017

Related U.S. Application Data

(60) Provisional application No. 62/193,689, filed on Jul. 17, 2015.

(51) Int. Cl.
*H01L 29/778* (2006.01)
*H01L 29/20* (2006.01)
(Continued)

(52) U.S. Cl.
CPC ...... *H01L 29/7784* (2013.01); *H01L 29/2003* (2013.01); *H01L 29/205* (2013.01); *H01L 29/66431* (2013.01); *H01L 29/66462* (2013.01); *H01L 29/778* (2013.01); *H01L 29/7782* (2013.01); *H01L 29/7783* (2013.01); *H01L 29/7786* (2013.01)

(58) Field of Classification Search
None
See application file for complete search history.

(56) References Cited

U.S. PATENT DOCUMENTS 6,100,549 A    8/2000  Weitzel et al.
6,777,278 B2   8/2004  Smith et al.
(Continued)

FOREIGN PATENT DOCUMENTS

JP    20130161478 A1    10/2013

OTHER PUBLICATIONS

R. S. Pengelly, S. M. Wood, J. W. Milligan, S. T. Sheppard, and W. L. Pribble, "A Review of GaN on SiC High Electron-Mobility Power Transistors and MMICs," IEEE Transactions on Microwave Theory and Techniques, vol. 60, No. 6, pp. 1764-1783, Jun. 2012.

(Continued)

*Primary Examiner* — Minh-Loan Tran
(74) *Attorney, Agent, or Firm* — Gene Vinokur; James McAleenan; Hironori Tsukamoto (57) ABSTRACT

A semiconductor device includes a semiconductor structure forming a carrier channel, a barrier layer arranged in proximity with the semiconductor structure, and a set of electrodes for providing and controlling carrier charge in the carrier channel. The barrier layer is at least partially doped by impurities having a conductivity type opposite to a conductivity type of the carrier channel. The material of the barrier layer has a bandgap and thermal conductivity larger than a bandgap and thermal conductivity of material in the semiconductor structure.

20 Claims, 12 Drawing Sheets

(51) Int. Cl.
*H01L 29/205* (2006.01)
*H01L 29/66* (2006.01)

(56) References Cited

U.S. PATENT DOCUMENTS

| | | | |
|---|---|---|---|
| 7,098,490 B2 | 8/2006 | Micovic et al. | |
| 7,544,963 B2 | 6/2009 | Saxler et al. | |
| 7,838,905 B2 | 11/2010 | Brar et al. | |
| 7,842,134 B2 | 11/2010 | Whitehead et al. | |
| 7,851,857 B2 | 12/2010 | Fu et al. | |
| 7,888,171 B2 | 2/2011 | Korenstein et al. | |
| 7,892,881 B2 | 2/2011 | Chen et al. | |
| 8,193,562 B2 | 6/2012 | Suh et al. | |
| 8,435,833 B2 | 5/2013 | Linares et al. | |
| 8,575,657 B2 | 11/2013 | Gambin et al. | |
| 8,759,879 B1 | 6/2014 | Tipirneni et al. | |
| 9,035,355 B2 | 5/2015 | Ostermaier et al. | |
| 2002/0185655 A1 | 12/2002 | Fahimulla et al. | |
| 2003/0020092 A1* | 1/2003 | Parikh | H01L 29/518 257/192 |
| 2008/0296618 A1 | 12/2008 | Suh et al. | |
| 2010/0171150 A1* | 7/2010 | Smith | H01L 29/42312 257/194 |
| 2011/0092057 A1* | 4/2011 | Suvorov | H01L 21/0465 438/522 |
| 2013/0062621 A1* | 3/2013 | Fichtenbaum | H01L 29/66462 257/77 |
| 2013/0153923 A1 | 6/2013 | Decoutere | |
| 2014/0091310 A1 | 4/2014 | Joen et al. | |
| 2014/0091366 A1 | 4/2014 | Joen et al. | |
| 2014/0110722 A1 | 4/2014 | Kub et al. | |

OTHER PUBLICATIONS

S. Karmalkar and U. K. Mishra, "Enhancement of breakdown voltage in AlGaN/GaN high electron mobility transistors using a field plate," Electron Devices, IEEE Transactions on, vol. 48, No. 8, pp. 1515-1521, 2001.

Koehler et al. "Boron Doped P+ Nanocrystalline Diamond Gate Electrode for AlGan/Gan HEMTs," CS Mantech Conference, Denver, Colorado, US. May 19, 2014. pp. 109-112.

* cited by examiner

SEMICONDUCTOR DEVICE WITH MULTIPLE-FUNCTIONAL BARRIER LAYER

RELATED APPLICATION

This application claims priority from a provisional application 62/193,689 filed on Jul. 17, 2015 and incorporated herein by reference.

FIELD OF THE INVENTION

The present invention relates generally to semiconductor device, and more particularly to semiconductor devices with barrier layer, such a back-barrier or a cap layer.

BACKGROUND OF THE INVENTION

Semiconductor devices have a significant role in solving energy challenges. Specifically, nitride power transistors have great potential in the application of advanced transportation systems, reliable energy delivery networks and many new approaches for high-efficiency electricity generation and conversion. Those systems rely on very efficient converters to step-up or step-down electric voltages. Most of these devices are made of silicon (Si). However, the limited breakdown voltage and frequency response of Si, and its higher resistance make the commercial devices and circuits currently available very bulky, heavy and inappropriate for future power applications. As an alternative, gallium nitride (GaN) devices have achieved record combination of high-voltages, high frequency response and low on-resistances for power applications.

GaN power devices, such as the GaN-based high electron mobility transistors (HEMTs), are regarded as one of the most promising candidates for high-power, high-voltage and high frequency applications. GaN HEMTs have achieved up to 10 times higher power density of GaAs HEMTs with much larger breakdown voltage ($V_B$) and current density, as well as a high cut-off frequency of over 400 GHz. State-of-the-art power levels have been demonstrated on silicon carbon (SiC) substrates with total output powers of 800 W at 2.9 GHz and over 500 W at 3.5 GHz. However, for the high-power applications, such as high-power motors, a higher output power, i.e. 3~5 kW, is desired, which requires a further enhancement of output power of semiconductor devices.

SUMMARY OF THE INVENTION

Some embodiments of an invention are based on a recognition that a number of different methods can be used to enhance the output power of semiconductor devices. For example, it is possible to increase the breakdown voltage of a semiconductor device by depleting a carrier channel in the semiconductor device by a vertical electric field. Other methods for enhancing device power capability include thermal management and reduction of the power loss due to parasitic leakage of the carrier charge. However, each method can enhance power capability of the semiconductor device only to some extent.

Some embodiments of the invention are based on a realization that those power enhancement methods can be implemented by carefully selecting property of material forming the semiconductor device. Despite the fact that different properties of different materials are used by different power enhancement methods, it was realized that the property of the material, as contrasted with, e.g., shape of the material, is one of the driving force behind those power enhancement methods.

For example, depletion of the carrier channel can be performed by a layer of material at least partially doped by impurities having a conductivity type opposite to a conductivity type of the carrier channel. The thermal management of the semiconductor device can be performed by a layer of material having thermal conductivity larger than the thermal conductivity of a material in the semiconductor structure forming the carrier channel. Similarly, the leakage of the carrier charge can be reduced by a layer of material having a bandgap larger than the bandgap of a material in the semiconductor structure forming the carrier channel.

Some embodiments of the invention are based on a realization that it is possible to select a single material with properties used by different power encasement methods. In such a manner, a single layer of such a material can be used to perform multiple power enhancement functions, while reducing overall cost of the semiconductor device.

Accordingly, one embodiment discloses a semiconductor device including a semiconductor structure forming a carrier channel, a barrier layer arranged in proximity with the semiconductor structure and a set of electrodes for providing and controlling carrier charge in the carrier channel. The barrier layer is at least partially doped by impurities having a conductivity type opposite to a conductivity type of the carrier channel. Material of the barrier layer has a bandgap and thermal conductivity larger than a bandgap and thermal conductivity of material in the semiconductor structure.

Due to the larger bandgap, opposite-type doping and high thermal conductivity, the barrier layer can enhance channel carrier confinement, form a reduced surface field (RESURF) structure for electric field engineering and serve as a surface heat dissipation layer. Examples of barrier layer include back-barriers or cap layers.

One embodiment of the invention discloses A semiconductor device including a semiconductor structure forming a carrier channel; a barrier layer arranged in proximity to the semiconductor structure, wherein the barrier layer is at least partially doped by impurities having a conductivity type opposite to a conductivity type of the carrier channel, wherein material of the barrier layer has a bandgap and thermal conductivity larger than a bandgap and thermal conductivity of material in the semiconductor structure; and a set of electrodes for providing and controlling a carrier charge in the carrier channel.

Another embodiment discloses a semiconductor device including a semiconductor structure forming a carrier channel, wherein the semiconductor structure is a semiconductor heterostructure including a III-V channel layer and a III-V barrier layer, such that the carrier channel is a two-dimensional-electron-gas (2DEG) channel; a barrier layer arranged proximity to the semiconductor structure, wherein the barrier layer is at least partially p-type doped, wherein the barrier layer has a bandgap and thermal conductivity larger than a bandgap and thermal conductivity of material in the III-V channel layer; and a set of electrodes for providing and controlling carrier charge in the carrier channel.

Yet another embodiment discloses a method for making a semiconductor device including providing a substrate; making a semiconductor structure comprising at least a III-V channel layer forming a carrier channel in the semiconductor structure; making a barrier layer in proximity to the semiconductor structure, wherein the barrier layer has a bandgap and thermal conductivity larger than a bandgap and thermal conductivity of material in the III-V channel layer; doping the barrier layer with impurities having an opposite conductivity type to the carrier channel; and forming electrodes in an electrical contact with the carrier channel.

DETAILED DESCRIPTION OF THE PREFERRED EMBODIMENTS

Figure 1:
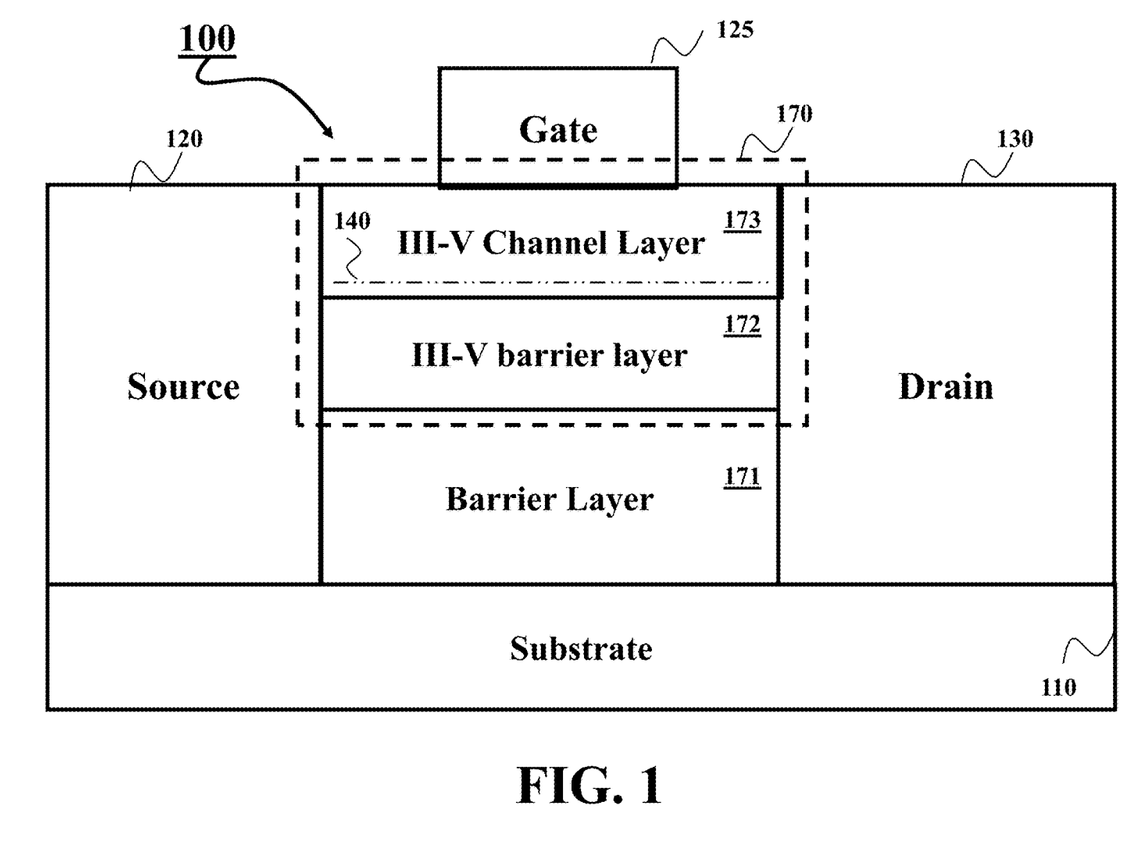
FIG. 1 is a cross-sectional diagram of a semiconductor device according to one embodiment of the invention.

FIG. 1 shows a cross-sectional diagram of a semiconductor device 100 according to one embodiment of the invention. In this embodiment, the semiconductor device includes a semiconductor structure 170 forming a carrier channel 140. For example, the semiconductor structure is a layer structure including a III-V channel layer 173 and a III-V barrier layer 172, such that the carrier channel 140 is a two-dimensional-electron-gas (2DEG) channel. For example, the material of the III-V channel layer can include one or combination of GaN or GaAs. The material of the III-V barrier layer can include one or combination of aluminum gallium nitride (AlGaN), indium gallium nitride (InGaN), indium aluminum gallium nitride (InAlGaN), aluminum nitride (AlN), aluminum gallium arsenide (AlGaAs), indium gallium arsenide (InGaAs), indium aluminum gallium arsenide (InAlGaAs).

The semiconductor device 100 also includes a barrier layer 171 arranged proximal to the semiconductor structure. The barrier layer extends in parallel with the carrier channel to fully or only partially overlap the carrier channel.

The barrier layer is at least partially doped with impurities having a conductivity type opposite to a conductivity type of the carrier channel. For example, the barrier layer can be at least partially p-type doped with one or combination of boron and magnesium. In one embodiment, thickness, doping concentration and length of the barrier layer are selected to completely deplete charges in the carrier channel at a breakdown voltage of the semiconductor device.

Also, the material of the barrier layer has a bandgap and thermal conductivity larger than a bandgap and thermal conductivity of the material in the semiconductor structure. For example, the material of the barrier layer can be selected to have a bandgap and thermal conductivity larger than a bandgap and thermal conductivity of material in the III-V channel layer. For example, the material of the barrier layer can include one or combination of diamond, boron nitride and aluminum nitride.

The semiconductor device 100 also includes a set of electrodes for providing and controlling carrier charge in the carrier channel. For example, the set of electrodes can include at least one source electrode 120 transmitting an electronic charge through the carrier channels, at least one drain electrode 130 receiving the electronic charge and at least one gate electrode 125 operatively connected to the semiconductor structure 170 for controlling a conduction of the carrier charge.

The semiconductor device can also include other layers, e.g., a substrate 110. In some embodiments, the barrier layer 171 is arranged between the substrate 110 and the semiconductor structure 170. In those embodiments, the barrier layer is a back-barrier layer. Alternatively, the barrier layer can be a cap layer arranged on top of the semiconductor structure.

Some embodiments of the invention are based on a realization that different power enhancement methods can be implemented by carefully selecting property of material forming the semiconductor device. Despite the fact that different properties of different materials are used by different power enhancement methods, it is realized that the property of the material, as contrasted with, e.g., shape of the material, is one of the driving force behind those power enhancement methods.

For example, depletion of the carrier channel can be performed by a layer of material at least partially doped by impurities having a conductivity type opposite to a conductivity type of the carrier channel. The thermal management of the semiconductor device can be performed by a layer of material having thermal conductivity larger than the thermal conductivity of a material in the semiconductor structure forming the carrier channel. Similarly, the leakage of the carrier charge can be reduced by a layer of material having a bandgap larger than the bandgap of a material in the semiconductor structure forming the carrier channel.

Some embodiments of the invention are based on a realization that it is possible to select a single material with properties used by different power encasement methods. In such a manner, a single layer of such a material can be used to perform multiple power enhancement functions, while reducing overall cost of the semiconductor device.

To that end, some embodiments include a multiple-functional barrier layer 171 in the semiconductor device. Due to the larger bandgap, opposite-type doping and high thermal conductivity, the barrier layer can enhance channel carrier confinement, form a reduced surface field (RESURF) structure for electric field engineering, and serve as a surface heat dissipation layer.

Figure 2:
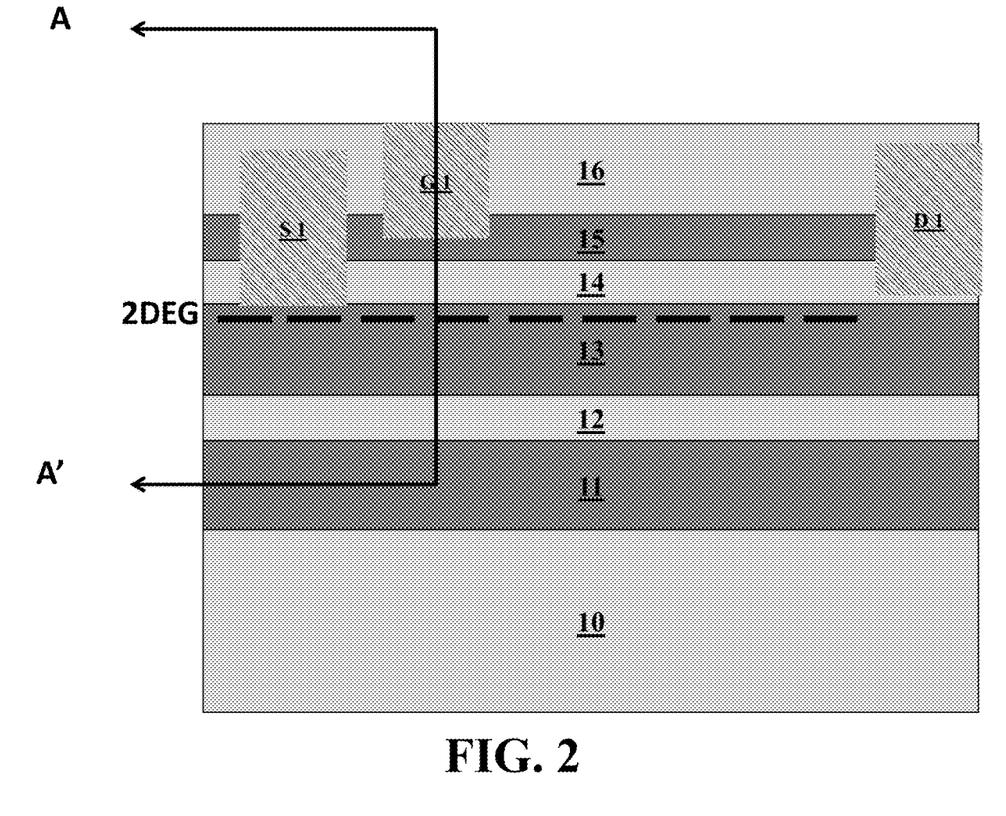
FIG. 2 is a cross-sectional diagram illustrating one embodiment of a semiconductor device with multi-functional back-barrier layer.

FIG. 2 shows a simplified cross-sectional diagram illustrating one embodiment of a III-V field effect transistor (FET) with multi-functional back-barrier layer. The region 10 includes diamond and can be a single substrate layer or include multiple layers such as transition layers between substrate layer and the doped layer 11. The layer 11 is a barrier layer that can concurrently serve multiple functions.

According to some embodiments, various methods can be adopted for the formation of the diamond region 10, including but not limiting to a Chemical Vapor Deposition (CVD), a Metal-Organic Chemical Vapor Deposition (MOCVD), a DC plasma CVD, microwave plasma deposition system. The region 10 can be undoped or can be intentionally doped with either n-type dopants or p-type dopants, including but not limiting to boron (B), nitrogen (N) and phosphorus (P). A diamond back-barrier layer 11 is disposed on the said diamond region 10, with an exemplary thickness in the range of 10 nm to 10 μm.

The back-barrier diamond layer 11 is fully or partially doped by impurities with a conductivity type opposite to the conductivity type of the carrier channel. For example, in some embodiments of GaN-based HEMTs, the diamond back-barrier layer 11 can be doped with p-type dopants such as B with an exemplary doping density in a range from $1 \times 10^{16}$ cm$^{-3}$ to $1 \times 10^{21}$ cm$^{-3}$. The dopants in the layer 11 can be added during epitaxial growth or can be added by ion implantation after the layer 11 is formed.

A semiconductor or dielectric region 12 is disposed on the diamond back-barrier layer 11. Region 12 can include a single layer or multiple buffer layers, including adhesion, nucleation, transition and other layers for promoting the growth of the compound semiconductor epitaxial layers on lattice-mismatched diamond. The materials of region 12 can be dielectrics such as $SiN_x$, $Al_2O_3$, $SiO_2$, binary III-V materials such as AlN or GaN, ternary III-V materials such as InGaN and AlGaN, and quaternary III-V materials such as aluminum indium gallium nitride (AlInGaN).

In some embodiments, the transition layers in region 12 can be a superlattice structure and compositionally-graded layers. A III-V semiconductor layer 13 is disposed on the region 12, with an exemplary thickness of 50 nm to 10 μm. In some embodiments, the materials of layer 13 can be III-nitride or III-arsenide materials. The layer 13 can be n$^-$-type (i.e., low-level doped n-type material) doped, un-intentionally doped, or p-type doped, but preferably as un-intentionally doped or with a conductivity type opposite to the said region 11.

A compound semiconductor layer 14 is disposed on the III-V semiconductor layer 13, with an exemplary thickness of 5 nm to 100 nm. The material of layer 14 has a different lattice constant and bandgap energy compared to material of layer 13. In some embodiments, the material of layer 14 has larger bandgap energy than the material of layer 13, and a 2DEG channel is formed at the heterostructure of layer 14 and layer 13. In one embodiment, materials of layer 14 and layer 13 can be InAlGaN and GaN, AlGaN and GaN, AlN and Gan, or InGaN and GaN.

According to some embodiments, various methods can be adopted for the formation of the compound semiconductor region 13 and 14, including but not limiting to a chemical vapor deposition (CVD), a metal-organic chemical vapor deposition (MOCVD), a molecular beam epitaxy (MBE) and a metal-organic vapor phase epitaxy (MOVPE).

The set of electrodes includes the source electrode S1, the gate electrode G 1 and drain electrode D 1 for the 2DEG channel. The source and drain electrodes S 1 and D 1 can be formed extending into the layer 14 and even into the layer 13, so as to form a connection to the 2DEG at the hetero-structure. In some embodiments, a dielectric layer 15 can be disposed on layer 14 and below the gate electrode G 1, to form a metal-insulator-semiconductor (MIS) or a MOS gate stack. The materials of regions 15 may include but is not limited to silicon oxide ($SiO_2$), silicon nitride ($Si_xN_y$), silicon oxide nitride hydrogen ($Si_xO_yN_zH_w$), aluminum oxide ($Al_2O_3$), hafnium oxide ($HfO_2$).

The gate stacks for the 2DEG channel can be either depletion-mode (D-mode) or enhancement-mode (E-mode). In some embodiments, the gate stack G 1 is intrinsically D-mode, meaning the threshold voltage ($V_{th}$) of the 2DEG channel is negative. In some embodiments, various methods can be used to transform the D-mode gate stack into E-mode for G 1, including but not limiting to: (a) partially etch layer 14 and 15 below the G 1; (b) implanting negative ions into the layer 13, 14 and 15 below the G 1, with the ions including but not limiting to fluorine and chlorine; (c) inserting a p-type semiconductor layer between the layer 14 and 15.

In some other embodiments, a dielectric region 16 can be formed as a passivation layer. Region 16 can include a single or multiple insulating layers, with the materials including but not limiting to $Al_2O_3$, $SiO_2$, AlN, $SiN_x$, $HfO_2$, nanocrystalline diamond.

Figure 3:
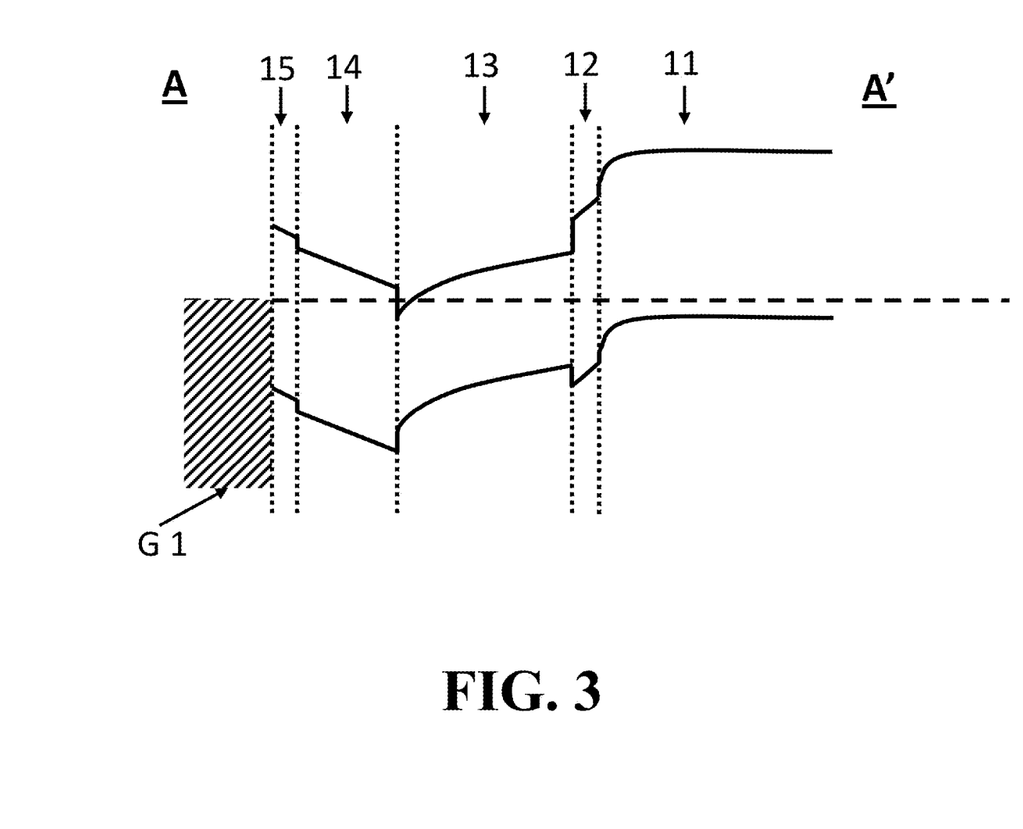
FIG. 3 is a band diagram of a cross-line AA' within the embodiment shown in FIG. 2.

FIG. 3 shows a band diagram of the cross-line AA' within the embodiment shown in FIG. 2. As shown, at the interface between the heterostructure formed by layer 13 and 14, the conduction band $E_c$ dips below the Fermi level $E_f$. Consequently, the electrons induced due to the piezoelectric effect and spontaneous doping form a 2DEG sheet charge region at the heterostructure. As the layer 11 is p-type and has a larger bandgap than the III-V material in layer 13, a large potential barrier forms between the layer 13 and 11 that opposes the movement of electrons from the 2DEG toward the buffer layer 11 and substrate region 10. Thus, the back-barrier layer 11 can enhance the 2DEG electron confinement.

Also, the back-barrier layer 11 can also function as a RESURF structure as it has an opposite doping type to the channel layer 13. As discussed above, the vertical p-n junction can help deplete the channel layer 13 on the device reverse bias, reduce the peak electric field in the layer 13 and increase the device breakdown without increasing device on-resistance. Finally, the back-barrier layer 11 can facilitate the heat dissipation due to a larger thermal conductivity of diamond compared to conventional III-V semiconductors. A reduction of channel peak temperature by at least 10% can be expected by inserting the diamond back-barrier layer 11, though more detailed simulation, optimization and experiments are needed to take full advantage of heat dissipation capability of diamond.

In some embodiments of the invention, the barrier layer extends in parallel with the carrier channel to only partially overlap the carrier channel. In alternative embodiments, the barrier layer is shortened and extends in parallel with the carrier channel to only partially overlap the carrier channel.

Figure 4:
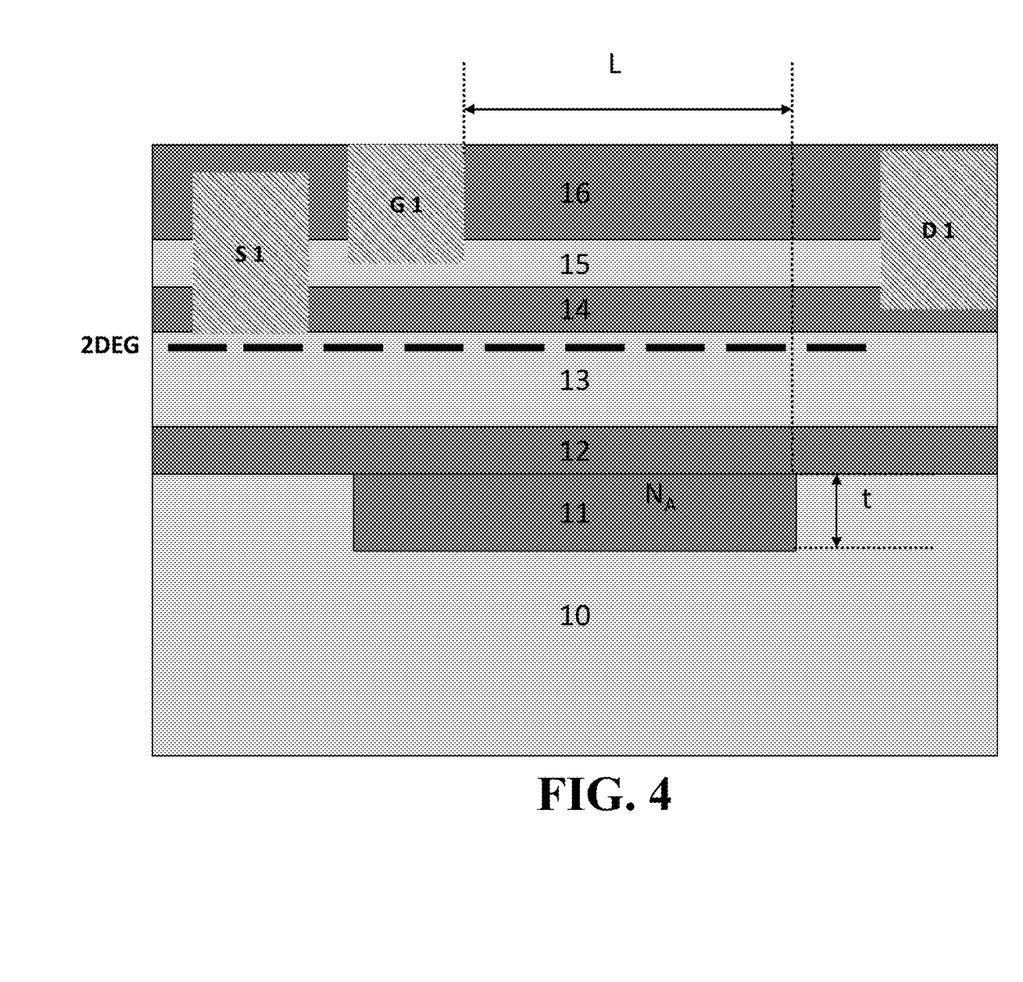
FIG. 4 is a cross-sectional diagram of a semiconductor device with shortened multi-functional barrier layer according to one embodiment of the invention.

FIG. 4 shows a cross-sectional diagram of a semiconductor device according to one embodiment of the invention with shortened multi-functional barrier layer. In this embodiment, the diamond back-barrier layer 11 is shortened to be only partially extending over the source-to-drain region. The shortened barrier layer 11 can be formed by ion implanting dopants through an implant mask into a top portion of the diamond region 10 or by an epitaxial growth process followed by an etching patterning process.

The design principle used by some embodiments of the invention for p-diamond back-barrier s is to completely deplete charges in the n-channel (e.g., 2DEG channel) by the p-n junction at breakdown. Three parameters, back-barrier thickness t, gate-edge to barrier-edge distance L and doping concentration $N_A$, are key factors to achieve the optimized design of p-diamond back-barrier. To that end, some embodiments of the invention select thickness, doping concentration and length of the barrier layer to completely deplete charges in the carrier channel at a breakdown point of the semiconductor device.

Figure 5A:
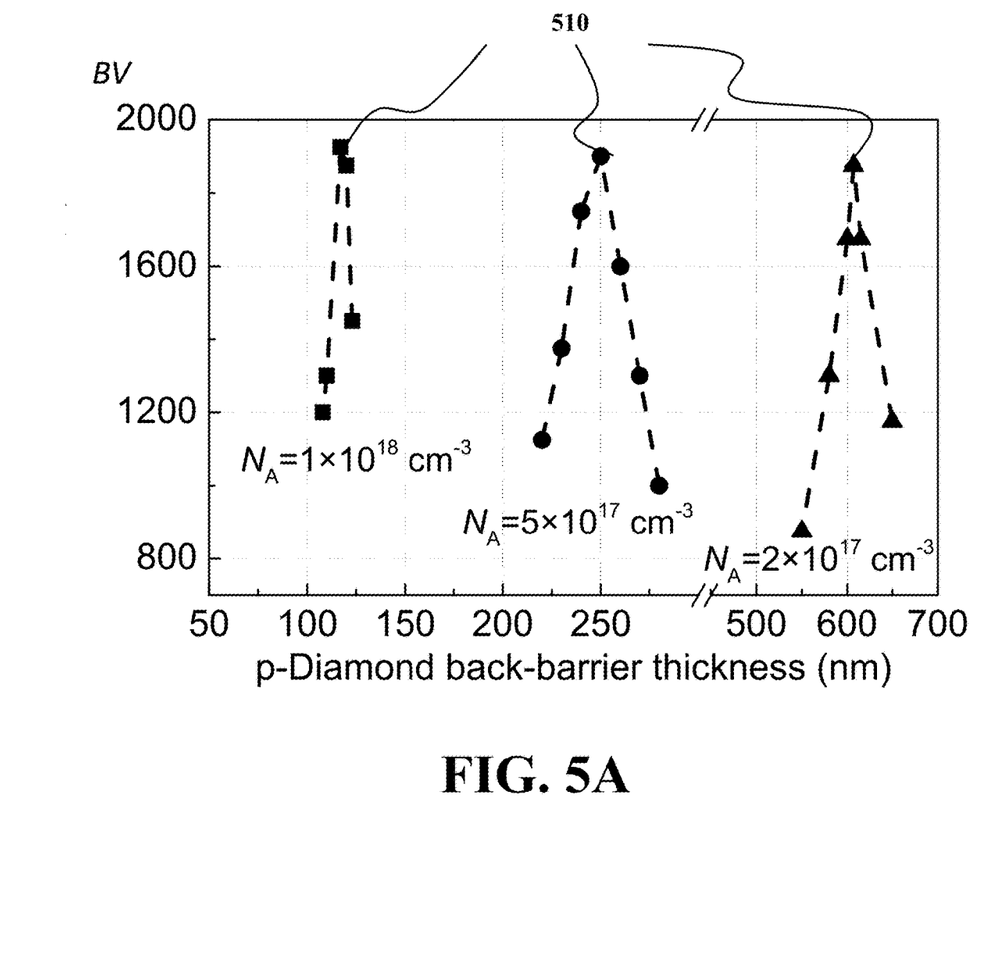
FIG. 5A is a graph of breakdown voltage (BV) as a function of doping concentration and thickness of the barrier layer.

FIG. 5A shows graphs for breakdown voltage (BV) as a function of doping concentration $N_A$ and thickness of the barrier layer. The graph shows that a maximum BV 510 can be achieved by different p-diamond doping concentration $N_A$, with different optimized p-diamond back-barrier thickness t correspondingly.

Figure 5B:
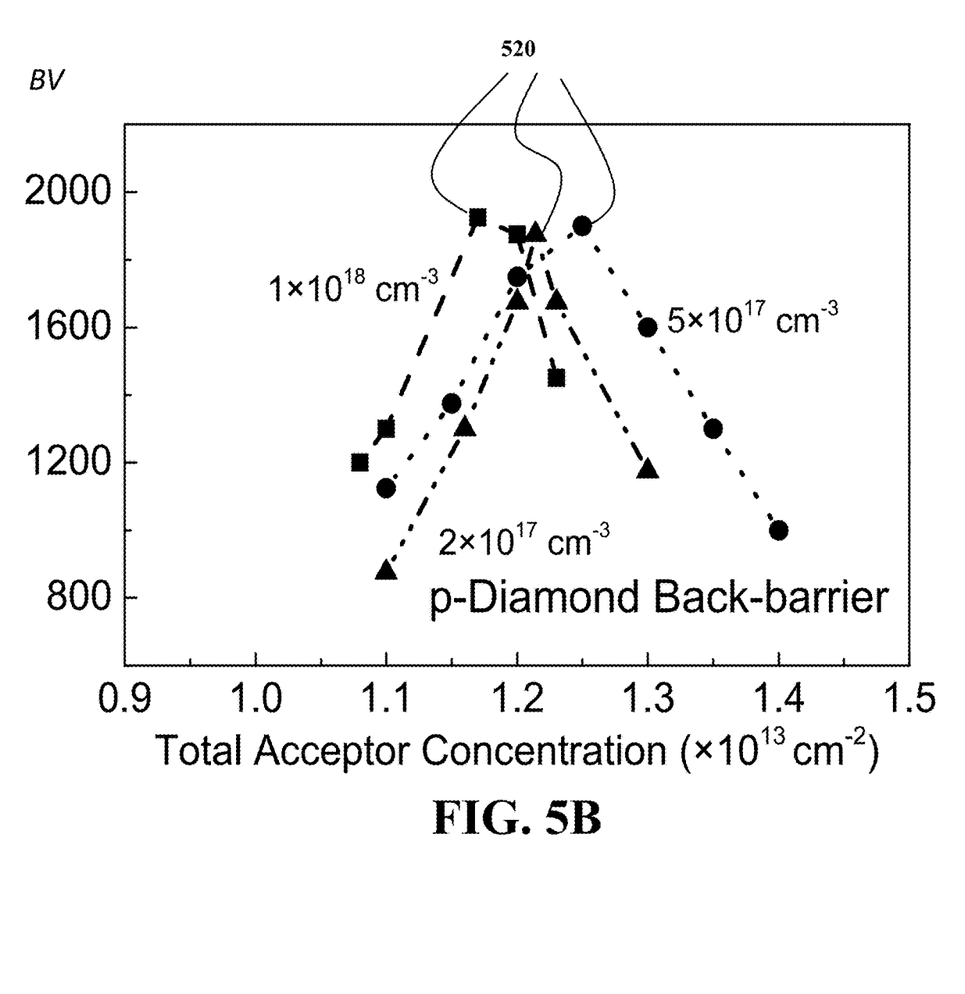
FIG. 5B is a graph of BV as a function of charge density.

FIG. 5B shows graphs for breakdown voltage (BV) as a function of charge density. The optimized $N_A$ and t shown in FIG. 5A correspond to the similar total charge density ($N_A \cdot t$) 520, which is equivalent to the n-channel carrier density (2DEG density in this example), showing the strong charge balance effect. In the optimized design, two equal E-field peaks appear at the gate and drain edge. Thus, for a patterned p-diamond back-barrier, the optimized design of gate-edge to back-barrier-edge distance L may further reduce the peak E-field at the drain edge or at the gate edge.

Figure 5C:
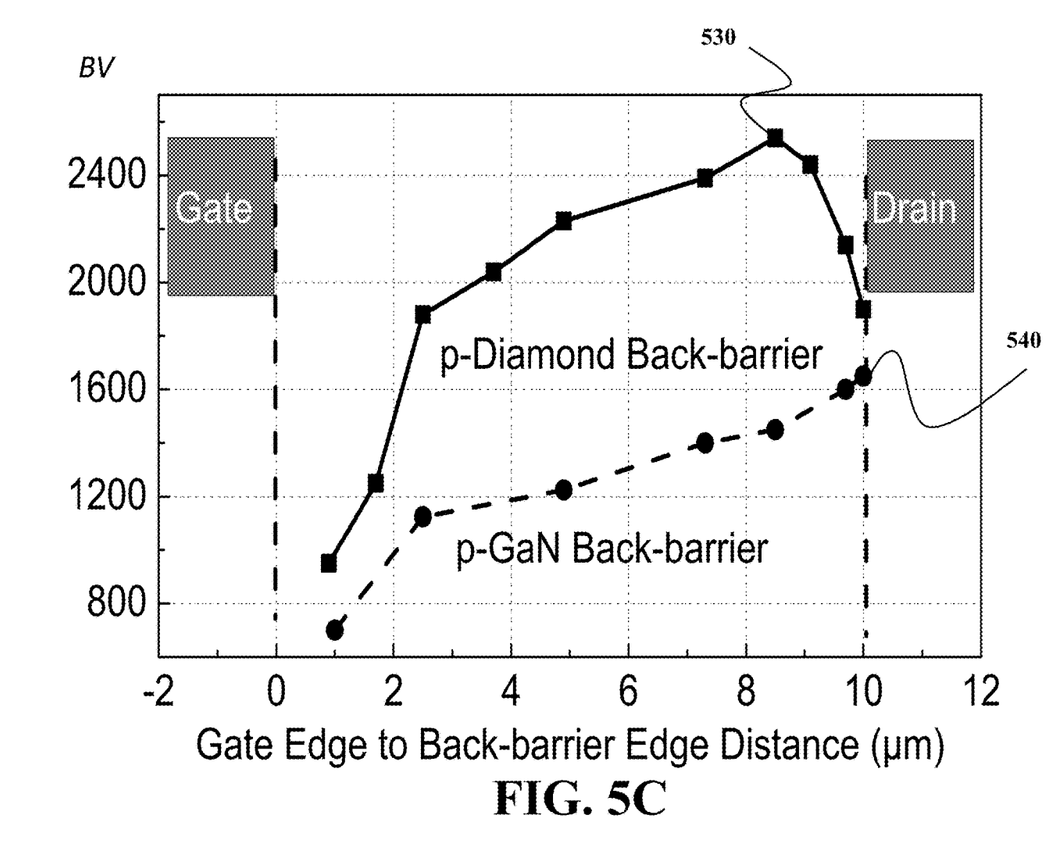
FIG. 5C is a graph of dependence of BV on a length of the p-diamond back-barrier according to some embodiments of the invention.

FIG. 5C shows graphs illustrating the dependence of BV on a length of the p-diamond back-barrier L. The graph shows that an optimized length $L_{BB}^{opt}$ 530 for diamond barrier layer is shorter, i.e., closer to the optimized length 540 for GaN barrier layer. To that end, some embodiments of the invention shorten the length of the multi-functional barrier layer, i.e., the barrier layer extends in parallel with the carrier channel to only partially overlap the carrier channel and does not reach the drain electrode.

For example, the breakdown could occur at gate edge when the back-barrier length $L_{BB}<L_{BB}^{opt}$, and at drain edge if $L_{BB}>L_{BB}^{opt}$. For $L_{BB}=L_{BB}^{opt}$, the breakdown may occur at the back-barrier edge on the p-n hetero-junction of layer 11 and layer 13, such to enable a more spread E-field in the layer 13. This E-field modulation effect is not observed for conventional p-GaN back-barrier, where the peak E-field in GaN always stays near the 2DEG channel rather than moves towards p-n junction and the BV reaches maximum when back-barrier extends to the drain side. This can be due to the relatively small vertical E-field in GaN p-n junctions compared to that in the p-diamond/n-GaN junction.

Figure 6:
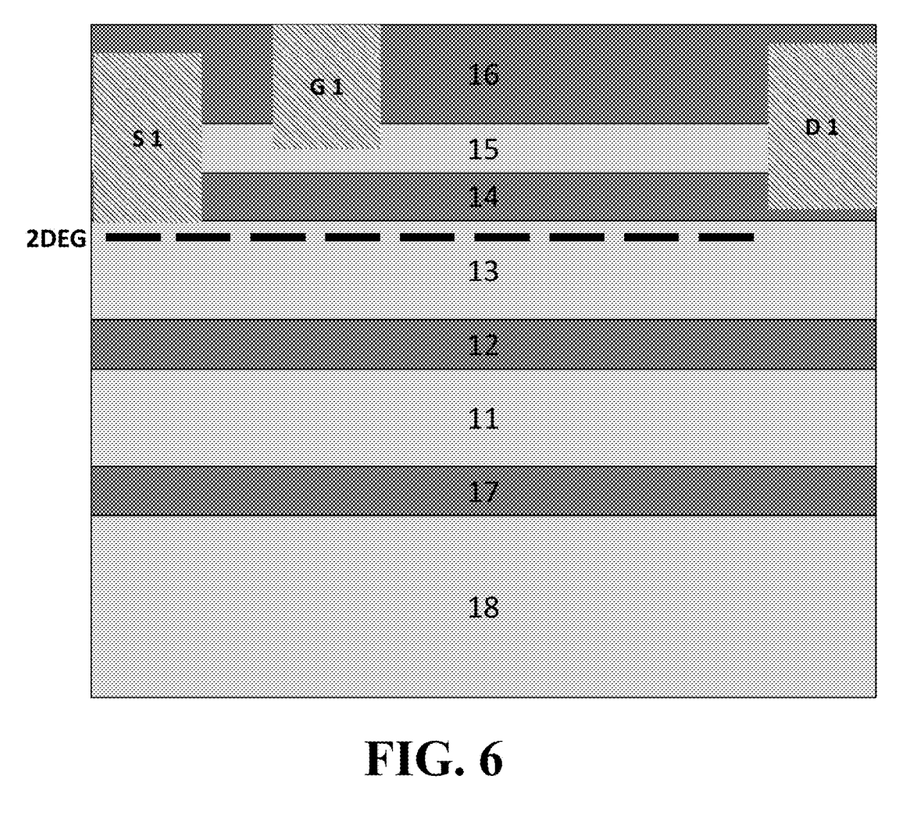
FIG. 6 is a cross-sectional diagram of the III-V semiconductor device with multi-functional back-barriers on different substrates according to one embodiment of the invention.

FIG. 6 shows a cross-sectional diagram of one embodiment of the III-V semiconductor device with multi-functional back-barriers on different substrates according to one embodiment of the invention. In this embodiment, the III-V semiconductor device with multi-functional back-barriers is formed on different substrates. The materials of the substrate layer 18 include but not limited to GaN, silicon (Si), sapphire, silicon carbide (SiC), diamond, zinc oxide, aluminum nitride (AlN), graphene. Region 17 is similar to the region 12, and can include a single layer or multiple layers, including the adhesion, nucleation, transition layers for promoting the growth or transfer of the said back-barrier layer 17 on the substrate region 18. The materials of the region 17 can be dielectrics, including but not limiting to $SiN_x$, $Al_2O_3$, $SiO_2$, and compound semiconductors, including but not limiting to binary III-V materials such as AlN or GaN, ternary III-V materials such as InGaN and AlGaN, and quaternary III-V materials such as AlInGaN. In some embodiments, the transition layers in region 17 can be superlattice structures and compositionally-graded layers.

GaN-Based Semiconductor Devices with Multi-Functional Cap Layers

Figure 7:
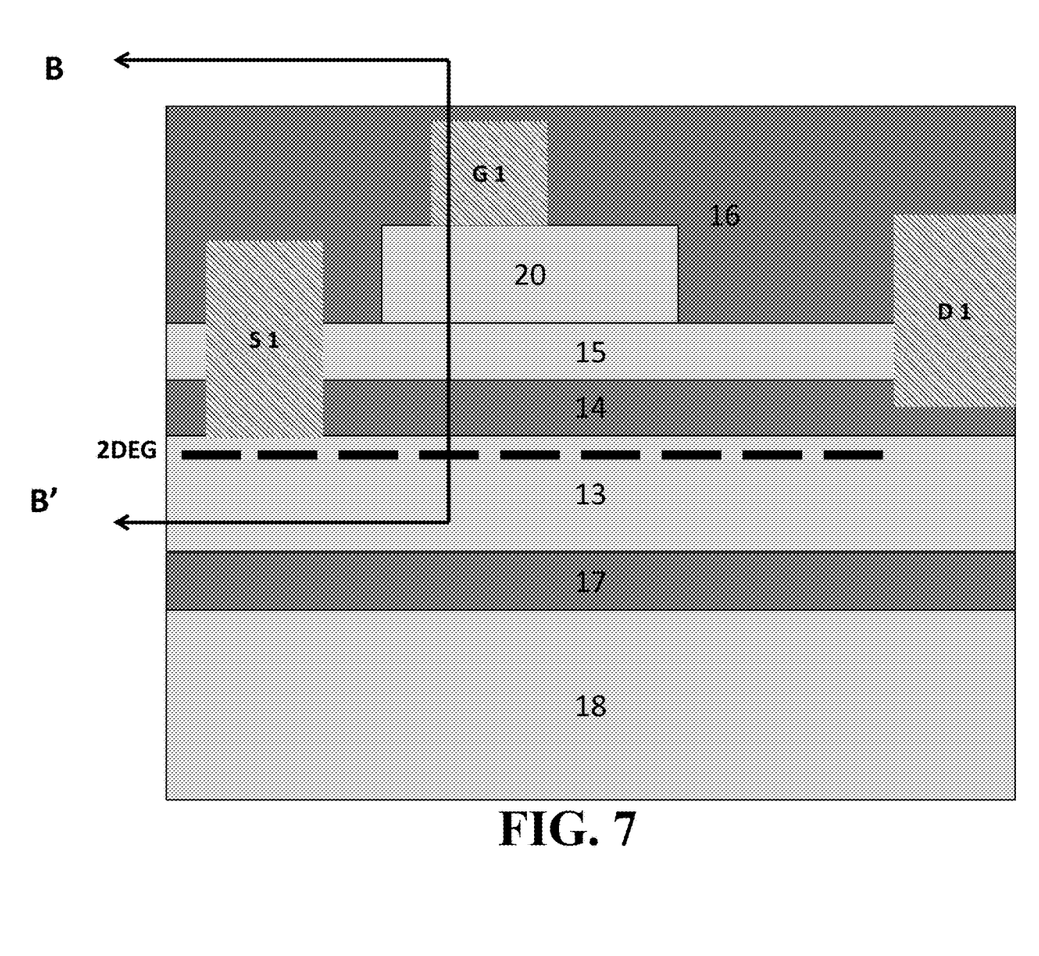
FIG. 7 is a cross-sectional diagram of a semiconductor device with multi-functional cap layer.

FIG. 7 shows a cross-sectional diagram of a semiconductor device with multi-functional cap layer. A diamond cap layer 20 is disposed on the gate dielectrics layer 15 or directly on the compound semiconductor layer 14, with an exemplary thickness of 10 nm to 10 μm. The diamond cap-layer 20 can extend fully or partially overlapping the source-to-drain regions. The diamond cap-layer 20 is fully or partially doped by impurities with a conductivity type opposite to the conductivity type of the carrier channel.

In one embodiment, the semiconductor device is GaN-based HEMTs, the diamond cap-layer 20' can be doped with p-type dopants such as B with an exemplary doping density of $1\times10^{16}$ cm-3 to $1\times10^{21}$ cm-3. The dopants in the said layer 11 may be added during epitaxial growth or may be added by ion implantation after the said layer 20 is formed.

In some embodiments, the gate electrode G 1 can extend on top of the cap-layer 20 and forms an Ohmic or Schottky contact with the cap-layer 20. In these embodiments, the gate electrode G 1 has simultaneous and direct control over the carrier channel and the cap-layer 20. Due to the larger bandgap, opposite-type doping and high thermal conductivity, the said cap-layer 20 can enhance channel carrier confinement, form a RESUF structure for electric field engineering and serve as a surface heat dissipation layer.

In some embodiments, the gate electrode G 1 is disposed on top of the cap-layer 20 and does not control the carrier channel directly. In these embodiments, as the cap-layer 20 has a conductivity type opposite to the carrier channel, the threshold voltage can be changed. For example, the cap-layer 20 can be fully or partially p-type doped to convert the device from depletion-mode (D-mode) to enhancement-mode (E-mode).

Figure 8:
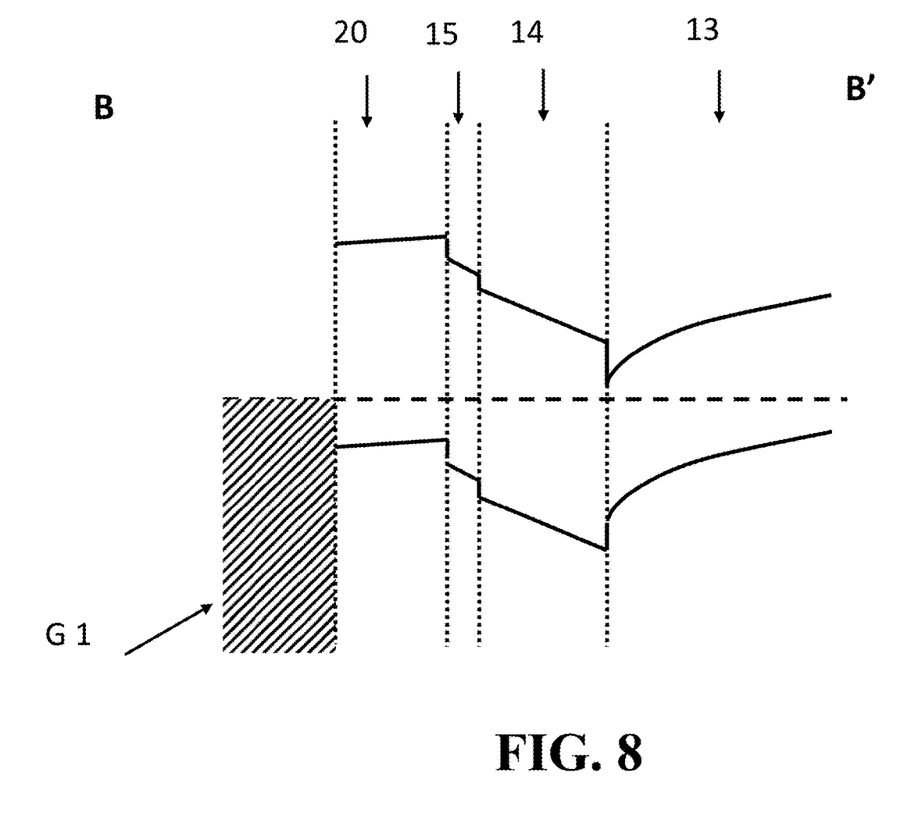
FIG. 8 is a band diagram of the embodiment shown in FIG. 7 along a cross-line BB'.

FIG. 8 is a band diagram of the embodiment shown in FIG. 7 along a cross-line BB'. As shown, the p-type cap-layer layer 20 lifts the energy band and enables the conduction band dip at the heterostructure of layer 13 and 14 to be higher than the Fermi level $E_f$. Consequently, the 2DEG is depleted at a zero gate bias, realizing an E-mode operation for the GaN-based HEMTs.

Figure 9:
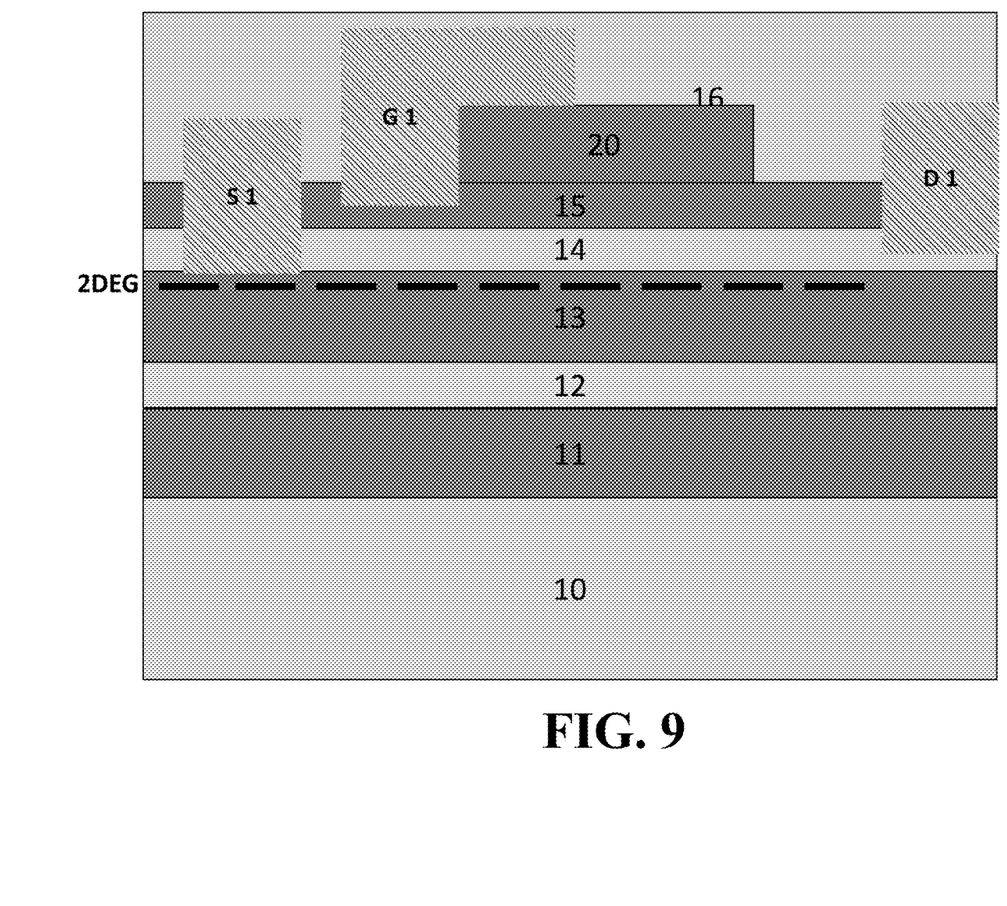
FIG. 9 is a cross-sectional diagram of a semiconductor device with multi-functional cap-layers and multi-functional back-barriers according to one embodiment of the invention.

FIG. 9 is a cross-sectional diagram of a semiconductor device according to one embodiment of the invention with multi-functional cap-layers and multi-functional back-barriers. In these embodiments, the multi-functional cap-barrier and back-barrier layers can co-exist in the same III-V device.

Fabrication Method

Figure 10:
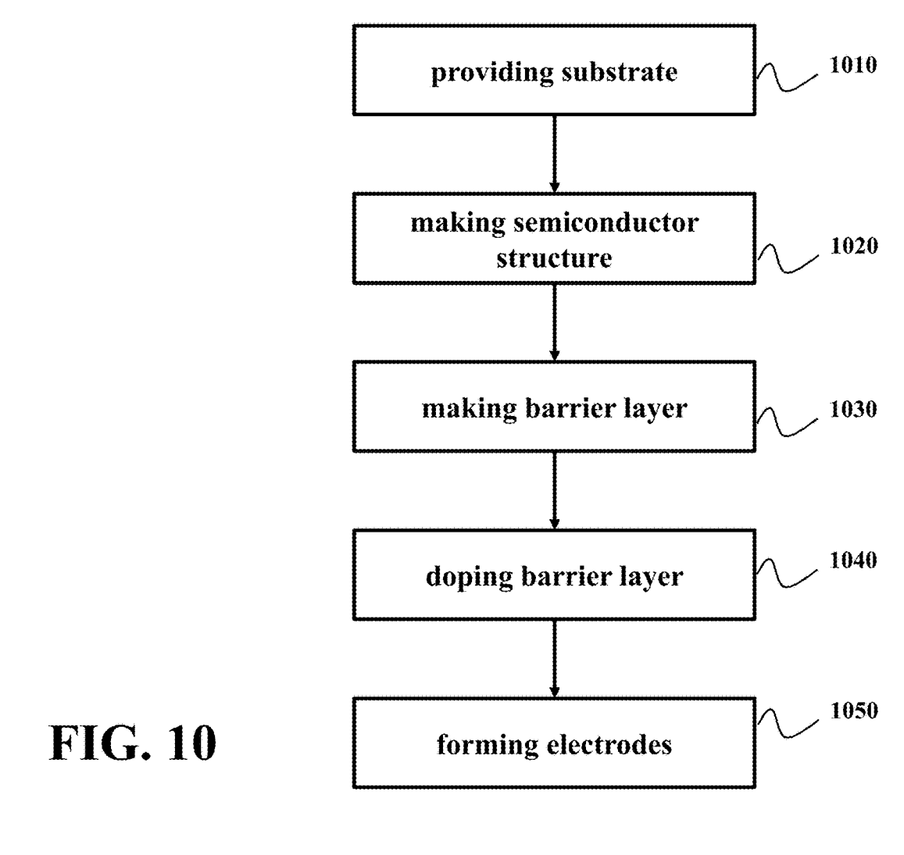
FIG. 10 is a block diagram of a method for making a semiconductor device according to some embodiment of the invention.

FIG. 10 shows a block diagram of a method for making a semiconductor device according to some embodiment of the invention. The method includes providing a substrate 1010, making 1020 a semiconductor structure comprising at least a III-V channel layer forming a carrier channel in the semiconductor structure, and making 1030 a barrier layer in proximity with the semiconductor structure. The material of the barrier layer has a bandgap and thermal conductivity larger than a bandgap and thermal conductivity of material in the III-V channel layer. In some embodiments, the barrier layer is arranged in parallel with the III-V channel layer to only partially overlap the III-V channel layer.

Further, the method also includes doping 1040 the barrier layer with impurities having an opposite conductivity type to the carrier channel and forming 1050 electrodes in an electrical contact with the carrier channel. The electrodes can be formed using one or combination of an ebeam deposition, a Joule evaporation, a chemical vapor deposition and a sputtering process.

Additionally, a buffer layer can also be formed adjacent to the barrier layer. The barrier layer can be formed as a back-barrier and/or a cap layer. In some embodiments, the method involves growth and formation of a substrate and a buffer region on the top surface of the substrate. According to some embodiments, various methods can be adopted for the growth and formation, including but not limiting to a Chemical Vapor Deposition (CVD), Metal-Organic Chemical Vapor Deposition (MOCVD), a Molecular Beam Epitaxy (MBE), a Metal-Organic Vapor Phase Epitaxy (MOVPE), a Plasma-Enhanced Chemical Vapor Deposition (PECVD) and a microwave plasma deposition system.

Various methods can be adopted for the growth and formation of the back-barrier layer, as listed for the formation of said substrates and buffer regions. The back-barrier may be doped during the epitaxial growth or by ion implantation after the back-barrier is formed. The III-V channel structure can be epitaxial grown on top of the said back-barrier layer or be transferred from another wafer structures. The cap-layer can be partially removed from contact and access regions. The cap-layer may be doped during the deposition/growth or by ion implantation after the cap-layer formation.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A semiconductor device, comprising:
    a semiconductor structure forming a carrier channel;
    a barrier layer arranged in proximity to the semiconductor structure, wherein the barrier layer is at least partially doped by impurities having a conductivity type opposite to a conductivity type of the carrier channel, wherein material of the barrier layer has a bandgap and thermal conductivity larger than a bandgap and thermal conductivity of material in the semiconductor structure; and
    a set of electrodes for providing and controlling a carrier charge in the carrier channel.

2. The semiconductor device of claim 1, further comprising:
    a substrate, wherein the barrier layer is a back-barrier layer arranged between the substrate and the semiconductor structure.

3. The semiconductor device of claim 1, wherein the barrier layer is a cap layer arranged on top of the semiconductor structure.

4. The semiconductor device of claim 1, wherein the material of the barrier layer includes one or combination of diamond, boron nitride and aluminum nitride.

5. The semiconductor device of claim 1, wherein thickness of the barrier layer is in a range from 10 nm to 10 µm.

6. The semiconductor device of claim 1, wherein doping concentration of the barrier layer is in a range from $10^{15}$ cm$^{-3}$ to $10^{22}$ cm$^{-3}$.

7. The semiconductor device of claim 1, wherein the barrier layer extends in parallel with the carrier channel to fully overlap the carrier channel.

8. The semiconductor device of claim 1, wherein the barrier layer extends in parallel with the carrier channel to only partially overlap the carrier channel.

9. The semiconductor device of claim 1, wherein thickness, doping concentration and length of the barrier layer are selected to completely deplete charges in the carrier channel at a breakdown voltage of the semiconductor device.

10. The semiconductor device of claim 1, wherein the semiconductor structure is a semiconductor hetero structure including a III-V channel layer and a III-V barrier layer, such that the carrier channel is a two-dimensional-electron-gas (2DEG) channel, wherein a bandgap of the III-V barrier layer is larger than a bandgap of the III-V channel layer, wherein the barrier layer is fully or partially p-type doped, and the material the back-barrier layer has a larger bandgap and thermal conductivity than the material of the III-V channel layer.

11. The semiconductor device of claim 10, wherein the material of the III-V channel layer includes one or combination of GaN or GaAs, and wherein the material of the III-V barrier layer includes one or combination of aluminum gallium nitride (AlGaN), indium gallium nitride (InGaN), indium aluminum gallium nitride (InAlGaN), aluminum nitride (AlN), aluminum gallium arsenide (AlGaAs), indium gallium arsenide (InGaAs), indium aluminum gallium arsenide (InAlGaAs).

12. A semiconductor device, comprising:
    a semiconductor structure forming a carrier channel, wherein the semiconductor structure is a semiconductor heterostructure including a III-V channel layer and a III-V barrier layer, such that the carrier channel is a two-dimensional-electron-gas (2DEG) channel;
    a barrier layer arranged proximity to the semiconductor structure, wherein the barrier layer is at least partially p-type doped, wherein the barrier layer has a bandgap and thermal conductivity larger than a bandgap and thermal conductivity of material in the III-V channel layer; and
    a set of electrodes for providing and controlling carrier charge in the carrier channel.

13. The semiconductor device of claim 12, wherein the material of the III-V channel layer includes one or combination of GaN or GaAs, and wherein the material of the III-V barrier layer includes one or combination of aluminum gallium nitride (AlGaN), indium gallium nitride (InGaN), indium aluminum gallium nitride (InAlGaN), aluminum nitride (AlN), aluminum gallium arsenide (AlGaAs), indium gallium arsenide (InGaAs), indium aluminum gallium arsenide (InAlGaAs).

14. The semiconductor device of claim 12, wherein the p-type dopants of the barrier layer include one or combination of boron and magnesium.

15. The semiconductor device of claim 12, wherein the barrier layer extends in parallel with the III-V channel layer to only partially overlap the III-V channel layer.

16. A method for making a semiconductor device, comprising:
    providing a substrate;
    making a semiconductor structure comprising at least a III-V channel layer forming a carrier channel in the semiconductor structure;
    making a barrier layer in proximity to the semiconductor structure, wherein the barrier layer has a bandgap and thermal conductivity larger than a bandgap and thermal conductivity of material in the III-V channel layer;
    doping the barrier layer with impurities having an opposite conductivity type to the carrier channel; and
    forming electrodes in an electrical contact with the carrier channel.

17. The method of claim 15, further comprising:
    forming a buffer layer adjacent to the barrier layer.

18. The method of claim 15, further comprising:
    arranging the barrier layer in parallel with the III-V channel layer to partially overlap the III-V channel layer.

19. The method of claim 15, wherein the semiconductor structure and the barrier layer are made using one or combination of a Chemical Vapor Deposition (CVD), Metal-Organic Chemical Vapor Deposition (MOCVD), a Molecular Beam Epitaxy (MBE), a Metal-Organic Vapor Phase Epitaxy (MOVPE), a plasma-enhanced chemical vapor deposition (PECVD), and a microwave plasma deposition.

20. The method of claim 15, wherein the electrodes are formed using one or combination of an electron beam physical vapor deposition (EBPVD), a Joule evaporation, a chemical vapor deposition, and a sputtering process.

* * * * *